United States Patent
Herbert

(10) Patent No.: US 7,136,285 B1
(45) Date of Patent: Nov. 14, 2006

(54) WAVE-FANS AND WAVE-FANS WITH HEAT SINKS

(76) Inventor: Edward Herbert, 1 Dyer Cemetery Rd., Canton, CT (US) 06019-2029

(*) Notice: Subject to any disclaimer, the term of this patent is extended or adjusted under 35 U.S.C. 154(b) by 319 days.

(21) Appl. No.: 10/710,794

(22) Filed: Aug. 3, 2004

Related U.S. Application Data

(60) Provisional application No. 60/481,173, filed on Aug. 4, 2003.

(51) Int. Cl.
*H05K 7/20* (2006.01)

(52) U.S. Cl. ............ 361/695; 361/692; 361/697; 361/703; 165/80.3; 165/121; 257/706; 416/189; 416/169 A; 416/192; 415/119

(58) Field of Classification Search ........ 361/686–695, 361/704–712, 717–719; 454/184; 165/80.3, 165/104.33, 104.34, 121, 127, 165, 185; 415/1, 68, 66, 141, 67, 119; 416/5, 88, 142, 416/143, 146 R, 170 R, 186 R, 189, 169 A, 416/192, 223 B, 132 R, 210 R, 87, 131, 416/242, 235, 236 R, 237; 257/706, 722
See application file for complete search history.

(56) References Cited

FOREIGN PATENT DOCUMENTS

| JP | 402257996 A | * | 10/1990 |
| JP | 02001012381 A | * | 1/2001 |

* cited by examiner

*Primary Examiner*—Michael Datskovskiy

(57) ABSTRACT

A wave-fan comprises a wavy surface, generally sinusoidal in the direction of rotation, which rotates in close proximity to the fins of a heat sink. The wave-plane fan is suitable for use with a flat heat sink, and a wave-ring fan is suitable for use with a cylindrical heat sink. There are no airfoils as in a prior art fan. Instead, the ridges of the wave-fan agitate the air between the fins of the heat sink as each ridge passes, breaking down the boundary layer and effecting good heat flow into the air. In some embodiments of the wave-fan, the outer surfaces are smooth, so it is not a hazard to intruding fingers, so in many applications it may be used without a guard or enclosure. Incidental centrifugal force provides some airflow through the fan to transport the heated air away from the fan. Also, the configuration of the fan tends to keep contamination in the air out of the heat sink fins, so an inlet air filter may not be needed. Because the net airflow through the fan is low, less power is required and it is very quiet.

8 Claims, 6 Drawing Sheets

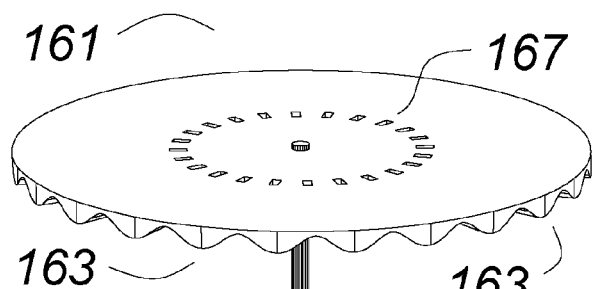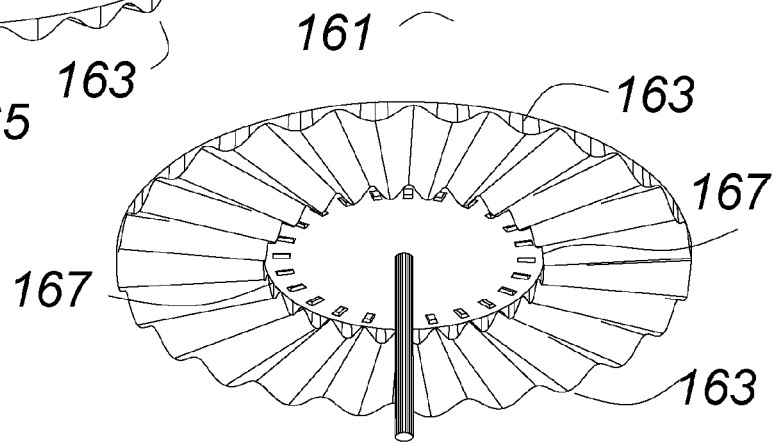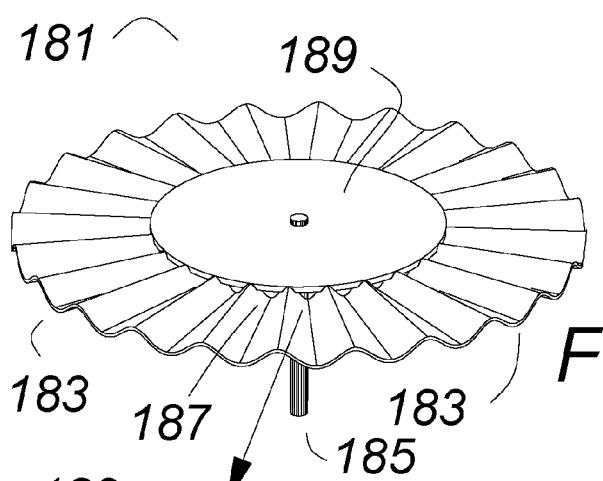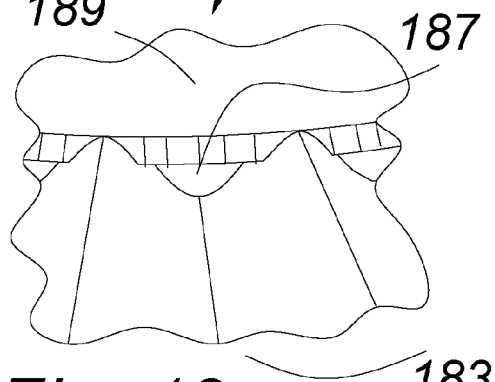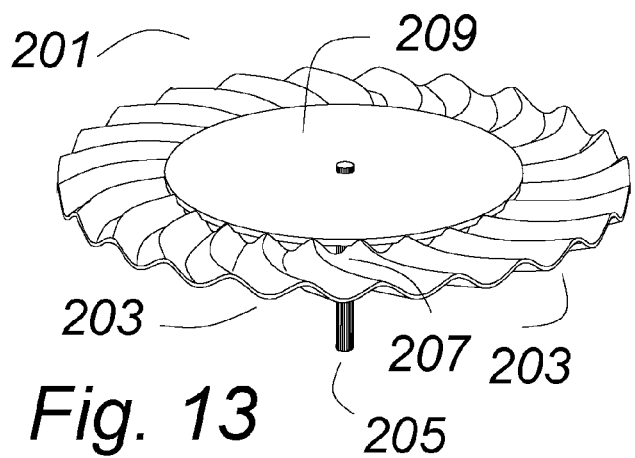

WAVE-FANS AND WAVE-FANS WITH HEAT SINKS

CROSS REFERENCE TO RELATED APPLICATIONS

This is a continuation in part application of a provisional patent application entitled: "Fan With Heat Sink", Ser. No. 60/481,173, filed 4 Aug. 2003.

BACKGROUND OF INVENTION

U.S. Pat. Nos. 5,297,617 and 5,445,215, both entitled FAN WITH HEAT SINK, and owned by the same entity as this patent application, teach that the area surrounding the fan blade tips in an axial flow fan has high velocity, very turbulent air, and that the periphery of an axial flow fan is an excellent heat sink, particularly if the inside of the fan duct and/or the fan blade are modified as taught therein to enhance the heat sinking. These are modified axial flow fans, and the air flow through them may be partly or completely redirected to fins or other features in the periphery of the fan duct, to remove heat therefrom. These patents are incorporated herein by reference.

Other related patent applications are: a provisional patent application entitled FAN WITH HEAT SINK USING STAMPED HEAT SINK FINS, Ser. No. 60/062,171, filed 16 Oct. 1997; a utility patent application of the same name, Ser. No. 09/174,374, filed 15 Oct., 1998 and issued as U.S. Pat. No. 6,125,920 on 3 Oct., 2000; a utility patent application of the same name, Ser. No. 09/678,424 filed 2 Oct., 2000; a utility patent application of the same name, Ser. No. 10/064,071 filed Jun. 6, 2002, and a utility patent application entitled FAN WITH HEAT SINK, Ser. No. 10/064,060 filed Jun. 5, 2002.

It is well known that a plurality of closely spaced fins makes an excellent heat sink. However, there is a boundary layer that is a very persistent viscous layer of air on the surfaces of the heat sink fins, requiring very high velocity and turbulent air flow to dissipate the boundary layer for heat flow into the air. In prior art heat sinks, this required very large, powerful and noisy fans.

Heat sinks made with a plurality of closely spaced fins are sometimes made by bonding heat sink fins into a grooved plate. A separate fan may blow air over the fins.

In the patent applications referenced above, air is not blown through the fins, as in going in one surface and out another, but rather, air is agitated between the fins on a single surface with no separate exit air path. The air in the vicinity of a plurality of fan blades is very turbulent and has a oscillating component as each of the fan blades passes any point on fins. Air is thus scrubbed in and out of the fins with very high local velocities to break up the boundary layer and transfer heat to the air. These fins can be on an inner surface, with internal fan blades, or on an external surface with external fan blades or both, or on a circular array of buttresses or posts rising from a plate. In the latter, there may be some air flow through the fins as well, but this is incidental. High velocity and turbulent air is needed to break up the boundary layer, but a modest movement of air is sufficient to transport the heat away. The rotation of the fan blades causes enough incidental air motion around the fan with heat sink to accomplish this. Thus a fan of low or moderate power can cause more vigorous local air movement immediately on the heat sink fins if the fan blades are very close than even a very powerful fan that is spaced apart. The fans and heat sinks of these inventions will be smaller, lighter, much quieter and consume much less power than prior art fans and heat sinks of the same heat capacity.

One embodiment of the invention teaches that a fan and heat sink can be a cold plate, which could be used for brick power supply modules, computer processors and the like or any other application requiring the removal of heat.

The heat sink fins may comprise a flat coil spring like strip of metal, similar to the familiar "Slinky" toy, placed in or on a cylinder of metal, or it may be like a closely pitched "clock spring" bonded onto a plate. Alternatively, the heat sink fins may comprise a stack of stamped metal rings pressed on or in a cylinder of metal. Alternatively, the heat sink fins may comprise a formed strip of metal that has been wrapped around a metal cylinder or attached to a flat plate. These may rest on the surface or may be pressed into complementary grooves in the surface.

SUMMARY OF INVENTION

The wave-fans of this invention do not comprise a plurality of blades, or airfoils, as in a conventional fan. The "wave-plane" and "wave-ring" fans comprise a wavy active surfaces of roughly sinusoidal contour along the direction of rotation with no openings between the ridges and valleys. The "wave-plane" fan is a flat fan, for use with a flat heat sink. The "wave-ring" fan is generally cylindrical with a wavy surface, for use with a cylindrical heat sink. Their function is to cause a pulsating fluid motion within a heat sinking means. As an example, not a limitation, the fluid may be air. Because the wave-fans are rotating, there will be a centrifugal component to the airflow. The pulsating air motion has very high local velocity, particularly as a ridge of the roughly sinusoidal contour passes a point on the heat sinking mean, to scrub away the boundary layer and effect good heat flow into the air. The comparatively low velocity airflow through the fan incidental to the centrifugal airflow carries the heated air away.

This arrangement has a number of benefits, among them a compact, low profile design, high efficiency, low noise and less susceptibility to dirt in the air. In some embodiments of the invention, the outer exposed surface is smooth, so they may be used in exposed locations without guards or housings. In the preferred embodiments of the invention, the centrifugal force on the air flowing through the fan is such that any contaminants tend to be thrown away from the heat sink, to greatly reduce the tendency of dust and so forth to clog the heat sink and reduce or eliminate the need for inlet air filters. Because the net air flow through the fan is much lower than in prior art fans, operation is very quiet and they requires less power.

BRIEF DESCRIPTION OF DRAWINGS

FIGS. 10 and 11 show the top and bottom surface of a wave-plane fan.

FIGS. 12 and 12*a* show another wave-plane fan.

FIG. 13 shows another wave-plane fan.

DETAILED DESCRIPTION

Figure 1:
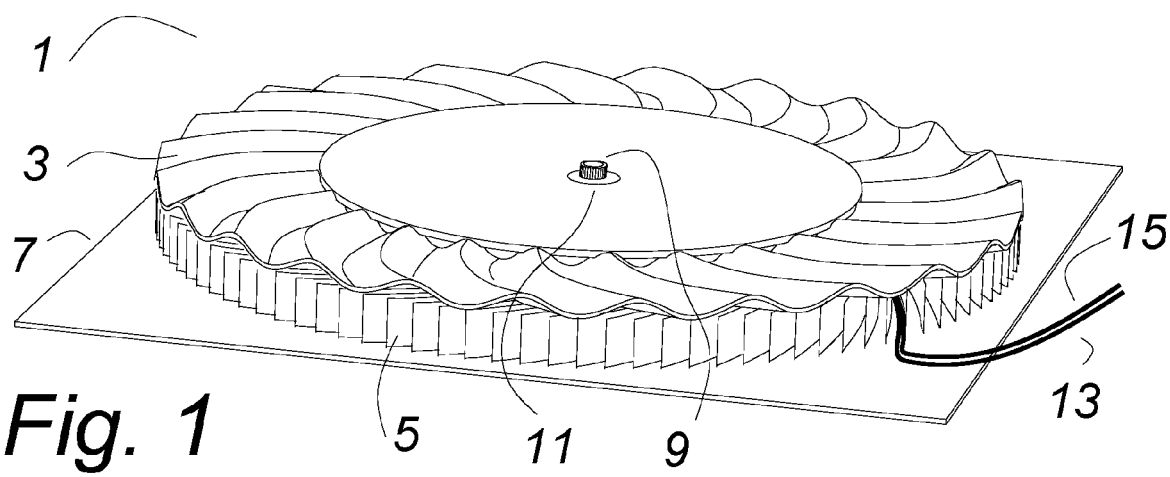
FIG. 1 shows a fan and heat sink having a flat wave-plane fan rotating above a flat finned heat sink.

FIG. 1 shows a wave-fan with a heat sink 1 comprising a wave-fan that is a wave-plane fan 3 rotating above a flat finned heat sinking means 5. A motor means (not visible) turns the fan 3. A motor shaft 11 turns the fan 3. The whole is on a base plate 7 that is a "cold plate". A tube 9 may run through the motor to locate and retain the motor and also to provide a vent access to the bottom surface of the base plate 7 to facilitate mounting to a heat source with vacuum. The fan 3 and the heat sink 5 are discussed in more detail below. Wires 13 and 15 may thread between fins of the heat sink 5 to provide power to the motor means (not visible).

The bottom surface of the wave-plane fan 3 comprises an active fluid moving surface comprises a plurality of ridges and valleys having a generally sinusoidal contour along the direction of rotation of the wave-plane fan 3. The top surface of the flat finned heat sinking means 5 is its active heat dissipating surface. The active surface of the wave-plane 3 and the active surface of the heat sinking means 5 are defined as being "generally flat", to contrast them with other possible geometries, for example "generally cylindrical" surfaces. Neither the active surface of the wave-plane fan 3 nor the active surface of the heat sinking means 5 are truly "flat" in the sense that a piece of paper is flat, but rather the term "generally flat" is used to express that the lowest part of the ridges of the wave-plane fan 3 lie in a plane, and that the highest parts of the heat sinking means 5 also lie in a plane, and the two planes are closely proximate.

As an example, not a limitation, the fluid may be air, and the wave-fan with a heat sink may be used to cool an object such as, as examples, not limitations, electronic assemblies or microprocessors.

Figure 2:
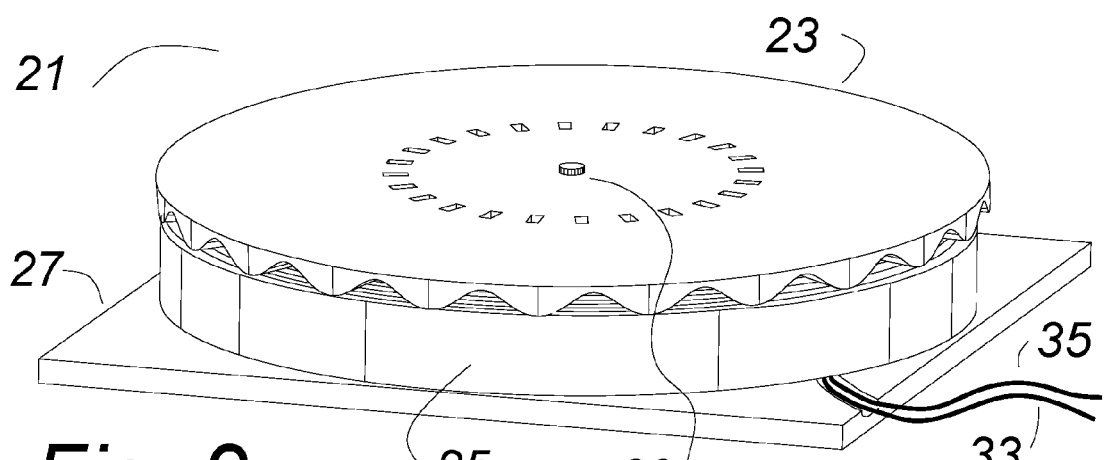
FIG. 2 shows another fan and heat sink having a flat wave-plane fan rotating above a flat finned heat sink.

FIG. 2 shows a fan with heat sink 21 comprising a wave-plane fan 23 rotating above a flat finned heat sink 25. A motor means (not visible) turns the fan 23. A motor shaft 29 turns the fan 23. The whole is on a base plate 27 which is a "cold plate". The fan 23 and the heat sink 25 are discussed in more detail below. Wires 33 and 35 may thread through a groove in the base plate 27 under the fins of the heat sink 25 to power the motor means (not visible). Note that the smooth top surface of the fan 23 reduces the risk of injury to intruding fingers and the like, so in many applications no guard or housing would be needed.

Figure 3:
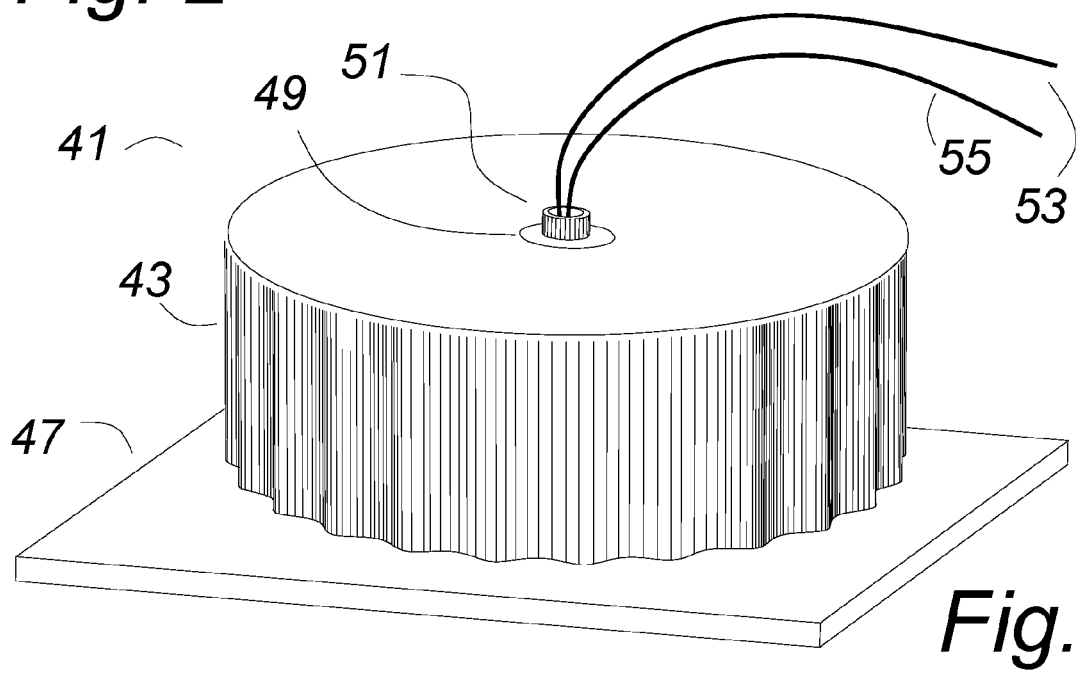
FIGS. 3 and 4 show another fan and heat sink having a circular wave-ring fan rotating around a cylindrical finned heat sink.
Figure 4:
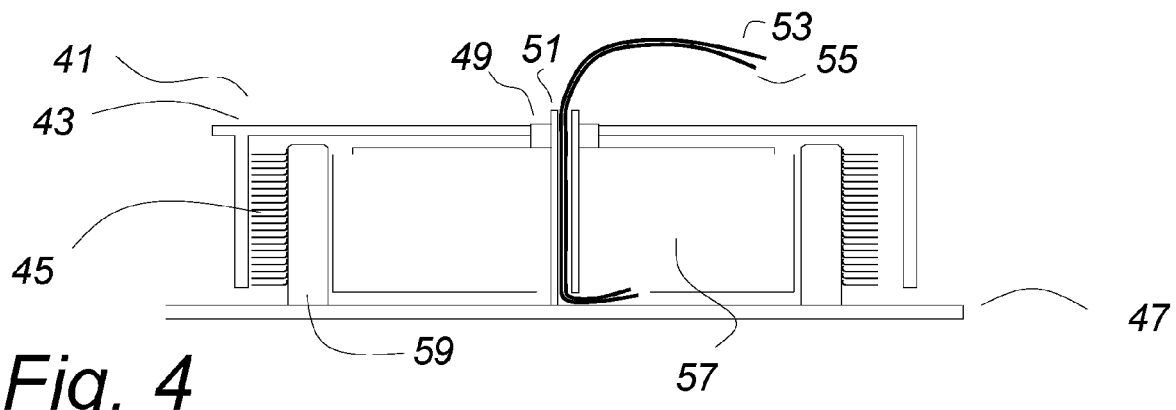

FIGS. 3 and 4 show a fan with heat sink 41 comprising a wave-fan that is a wave-ring fan 43 rotating around a cylindrical finned heat sinking means 45. A motor means 57 turns a motor shaft 49 that turns the fan 43. A tube 51 may extend through the motor means 57 to locate and retain it, and it may optionally provide a conduit for electrical wires 53 and 55. The whole is mounted on a base plate 47 which is a "cold plate" and which further comprises a metal cylinder 59 which is a heat conductor from the base plate 47 to the cylindrical finned heat sink 45. The fan 43 and the heat sink 45 are discussed in more detail below.

The active surface of the heat sink means 45 and the active surface of the wave-ring fan 43 are described as being "generally cylindrical" although neither surface is truly cylindrical as, for example, a pipe. The term is used to express that the most prominent points of the ridges of the wave-ring fan 43 lie in a cylinder, and the most prominent points of the heat sinking means 45 also lie in a cylinder, and the cylinders are concentric and closely proximate.

All three of the wave-fans 3, 23 and 43 discussed above have the common feature that they do not have fan blades in the usual sense. They comprise wavy active surfaces, roughly sinusoidal in the direction of rotation, close to the surface of the heat sink. The purpose of this configuration is to pulse the air into the heat sink fins at a fairly high rate with a very high local velocity as each ridge passes by due to a high pressure area in front of the ridge. After the ridge passes, the air will pulse out of the fins into the relatively low pressure area behind the ridge.

Each ridge of the roughly sinusoidal contour of the active surface forms a local venturi as it passes, so the air in the heat sink under the ridge will have a very high velocity and low pressure. This is ideal for breaking down the boundary layer and promoting good thermal conduction from the heat sink to the air.

Because the wave-fans (the wave-plane fans 3 or 23 or the wave-ring fan 43) have no blades, air does not pass through them due to the action of air foils as in prior art fans. Air is exchanged with the surrounding medium through two mechanisms. In a particular fan, one or the other may be the principle mechanism, but in many fans both are operative. One mechanism is that the fans are rotating at a fast speed, so there is a centrifugal component to the air movement between the wave-fan and the heat sink, tending to throw the air outward. If there are inboard vents, as in the fans 3 and 23, there will be an outward air flow to carry away the heated air. The second mechanism is that there is a differential pressure around the ends of the ridges, and also between the trailing edge of one ridge to the leading edge of the next. Where the air pressure is relatively higher, air tends to squish out of the fan. Where it is relatively lower, it will flow back into the fan. This causes a general stirring of the air with the ambient air around the edge of the wave-fan. The rotation of the wave-fan has a centrifugal component that throws air away form the wave-fan and ambient air flows back in to replace it, generally keeping the air around the heat sink surface stirred up and refreshed from ambient air.

Figure 5:
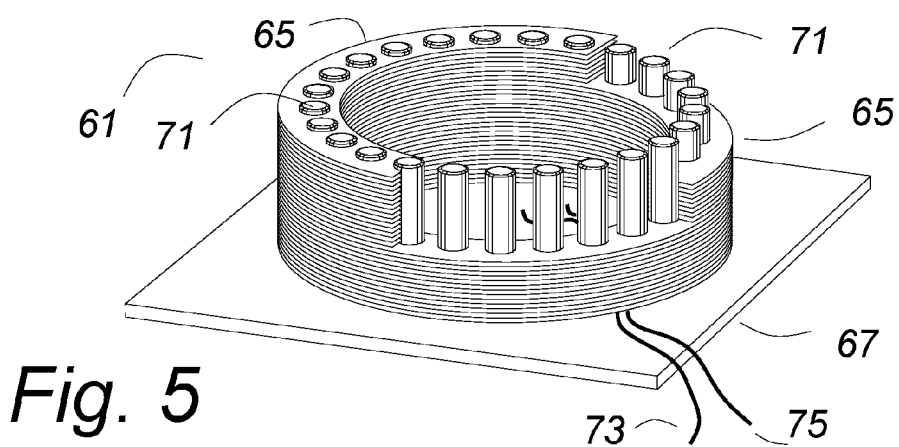
FIG. 5 shows a cylindrical finned heat sink.

FIG. 5 shows a representative cylindrical heat sink 61. A stack of heat sink fin rings 65, 65 is pressed upon a plurality of metal posts 71, 71 extending from a base plate 67 which is a "cold plate". Some of the rings 65, 65 are shown cut away for illustration only, to more clearly show the construction. In a practical heat sink 61 all of the rings 65, 65 would be complete and in place. There may be some space beneath the bottom ring for the electrical connection of the fan motor, shown as wires 73 and 75. Although this heat sink 61 has space between its fins so that air could flow between them, it is contemplated that the fins will be very closely spaced, so the airflow is restricted. The principle means of transferring heat out of the heat sink 61 is through the mechanism of pulsating air from a wave-ring fan, as described above. In an alternative embodiment, the posts may comprise tubes through which a fluid can flow. Manifold means on the ends of the tubes would direct the fluid flow as required.

Figure 6:
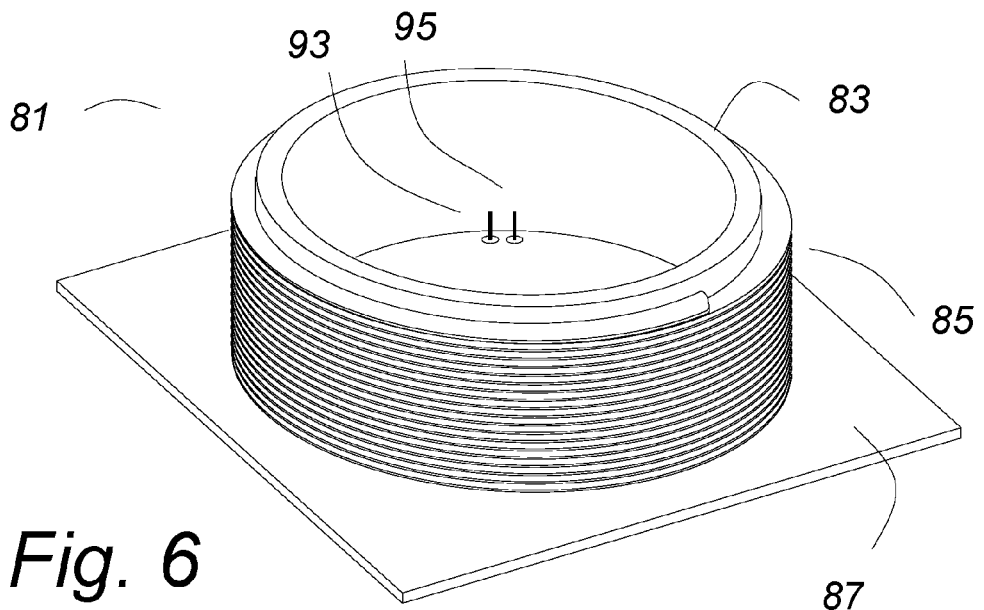
FIG. 6 shows another cylindrical finned heat sink.

FIG. 6 shows a representative cylindrical heat sink 81. A heat sink fin 85 is formed like a "Slinky" spring and wound upon a metal cylinder 83. The heat sink fin 85 may be bonded to the metal cylinder 83 as by reflow soldering or the like, or it may be retained and held firmly in place by the spring forces within the heat sink ring 85. The metal cylinder 83 may optionally have a groove there in to locate and retain the heat sink fin 85. The metal cylinder 83 is mounted on and integral to a base plate 87 which is a "cold plate". Optional terminal means 93 and 95 may extend through the base plate 87 to provide an electrical connection to a motor means to be installed later. This arrangement is advantageous when the motor means is being controlled by an electronic package that is mounted to the base plate 87 for cooling. In an alternative embodiment, the metal cylinder may contain channels for a circulating fluid.

Figure 7:
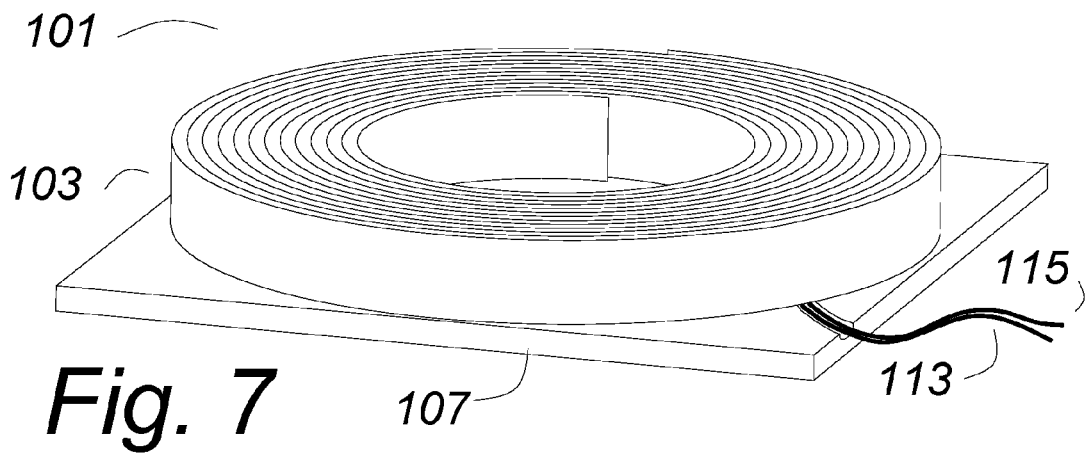
FIG. 7 shows a flat finned heat sink.

FIG. 7 shows a flat heat sink 101 comprising a heat sink fin 103 bonded to a base plate 107. The heat sink fin 103 is a continuous strip of metal wound like flat spring. A groove in the base plate 107 under the heat sink fin 103 may provide a conduit for wires 113 and 115 to power a motor means to be installed later. In an alternate embodiment, the base could contain channels for a circulating fluid.

Figure 8:
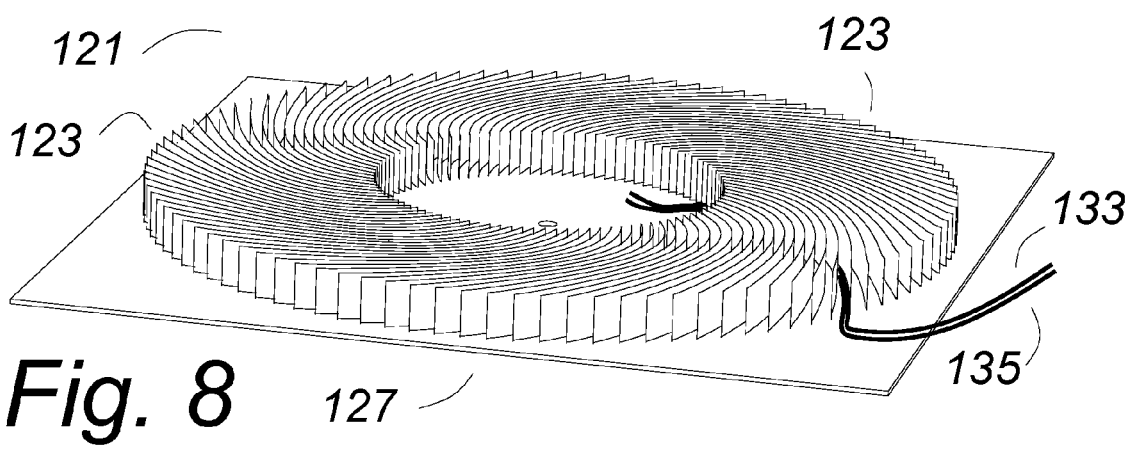
FIG. 8 shows another flat finned heat sink.

FIG. 8 shows a flat heat sink 121 comprising a plurality of heat sink fins 123—123 bonded to a base plate 127. Wires 133 and 135 may sneak between the heat sink fins to power a motor means to be installed later. A heat sink of this general configuration may also be fabricated by other means, such as, as illustrations, not limitations, by casting, impact extrusion, milling, etching and so forth.

Figure 9:
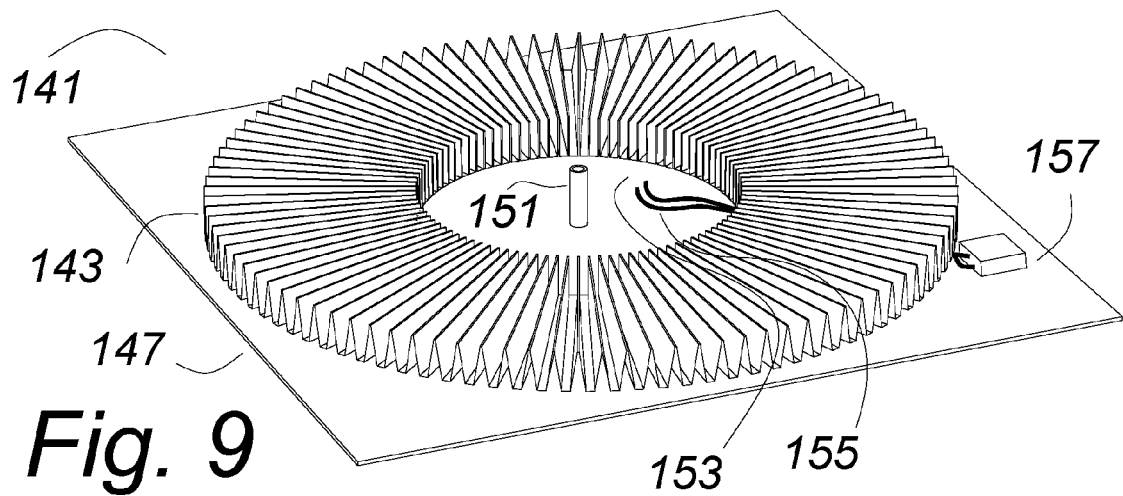
FIG. 9 shows another flat finned heat sink.

FIG. 9 shows a flat heat sink 141 comprising a heat sink fin 143 bonded to a base plate 147. The heat sink fin 143 comprises a continuous strip of metal which has been folded into a pleated heat sink fin pattern. When stretched into a flat circular shape, the outer pleats expand open somewhat because the outer circumference is longer. Wires 153 and 155 may sneak between the pleats to a connector means 157 to provide power to a motor means to be installed later. A central tube 151 may locate and retain the motor means and may also provide a vent to the bottom of the heat sink 141.

Note that the base plates 127 and 147 of FIGS. 8 and 9 respectively are fairly thin, and that the base plate 147 of FIG. 9 contains a central tube 151. These heat sinks have some slight flexibility, and can be attached to a surface from which heat is to be removed under vacuum to effect a good thermal interface.

In the specification and the claims, the term "heat sinking means"; "heat sink" and "cold plate" are used because they are the jargon of the art of heat sinks. Heat flow is reciprocal, however, so "heat sinking means" and "heat sink" also includes a source of heat as well as a sink for heat, and "cold plate" includes a hot plate, as they differ only in the direction of heat flow and are otherwise equivalent.

FIGS. 10 through 13 show wave-plane fans that would be suitable for use with the flat heat sinks of FIGS. 7 through 9 and the like.

FIGS. 10 and 11 show a wave-plane fan 161 having plane top surface and a plurality of ridges 163—163 on its bottom surface. A shaft 165 may connect to a motor means to rotate the fan 161. The wave-plane fan 161 may have a plurality of vents 167—167 inboard of the ridges 163—163. Note that the top surface of the fan 161 is smooth, so that it would not be a hazard to intruding fingers and the like. Accordingly, in many applications it could be used without a guard or enclosure.

FIGS. 12 and 12*a* show a wave-plane fan 181 having a plurality of ridges 183—183 on its active surface that is its bottom surface. The ridges radiate from a central disc 189. The fan 181 may have a plurality of fluid inlet ports, or vents, 187—187 at the juncture of the central disc 189 and the plurality of ridges 183—183. A shaft 185 may connect to a motor means to rotate the fan 181. Note that the vents 187—187 require air to enter the fan 181 "backwards", that is, against the centrifugal force. This tends to exclude dirt and contamination particles as they tend to be thrown outward, away from the inlet.

FIG. 13 shows a wave-plane fan 201 having a plurality of ridges 203—203 radiating from a central disc 209. The fan 201 may have a plurality of vents 207 at the juncture of the central disc and the plurality of ridges 203—203. A shaft 205 may connect to a motor means to rotate the fan 201. Although the roughly sinusoidal contour of the active surface is at an angle to the direction of rotation, it is none-the-less, for the purpose of this specification and the claims, said to be roughly sinusoidal contour in the direction of rotation, there being some flexibility in the expression. This fan is particularly suited for the heat sinking means 121 of FIG. 8, as the ridges may be generally more perpendicular to the fins of the heat sinking means, and air may thus be urged along the spaces between the heat sink fins. See also the fan and heat sink 1 of FIG. 1.

FIGS. 14 through 19 show wave-ring fans that would be suitable for use with the cylindrical heat sinks of FIGS. 5 and 6 and the like.

Figure 14:
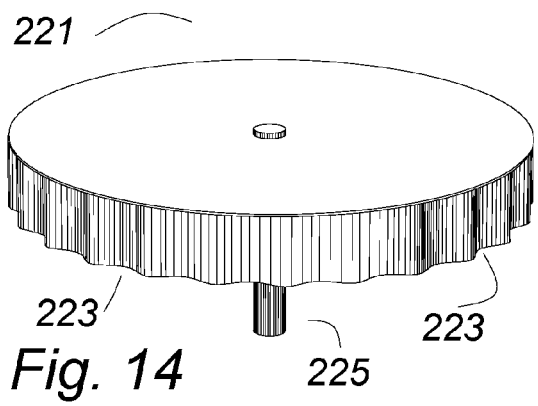
FIGS. 14, 15 and 16 show a wave-ring fan.
Figure 15:
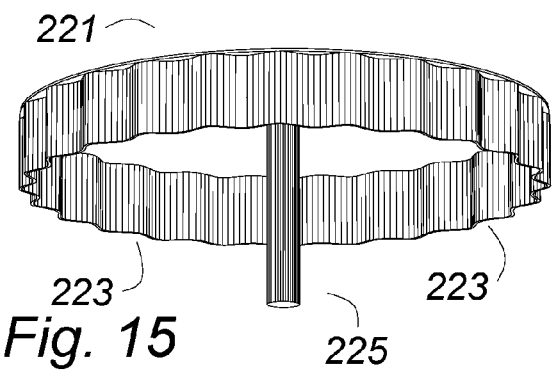
Figure 16:
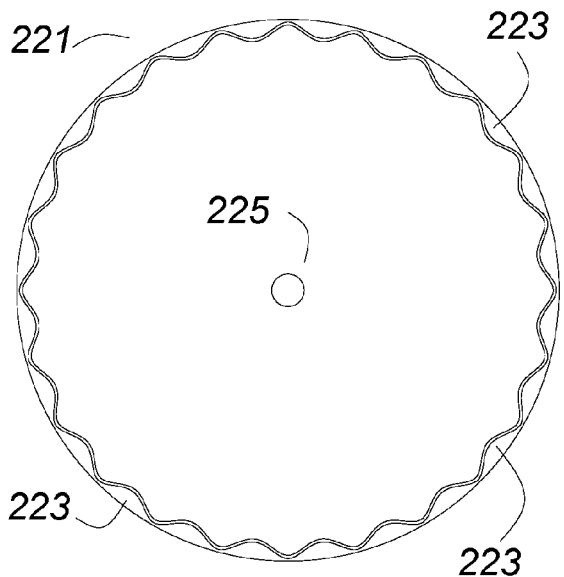

FIGS. 14 through 16 show a wave-ring fan 221 having a plurality of ridges 223—223 on its periphery. A shaft 225 may connect to a motor means to rotate the fan 221.

Figure 17:
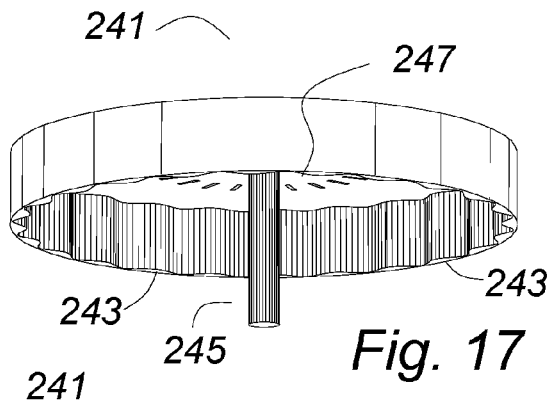
FIGS. 17 and 18 show another wave-ring fan.
Figure 18:
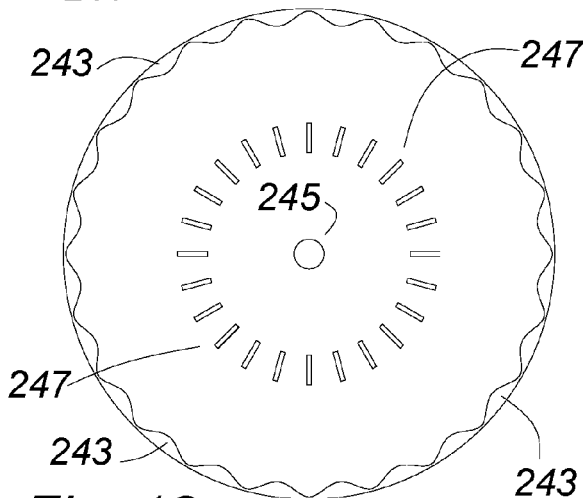

FIGS. 17 and 18 show a wave-ring fan 241 having a plurality of ridges 243—243 on its periphery. A shaft 245 may connect to a motor means to rotate the fan 241. A plurality of openings 247—247 collectively are an inlet for air which will flow outward as the fan 241 rotates. Note that the outer surface of the fan 241 is smooth, so that it would not be a hazard to intruding fingers and the like. Accordingly, in many applications it could be used without a guard or enclosure.

Note that air flowing into the plurality of openings 247—247 will flow generally radially to the periphery of the fan 241, then it will tend to flow through the space between the ridges 243—243 and exit from the bottom of the fan 241. As any contaminants in the air will be heavier than the air, centrifugal force will tend to keep them away from the rings of a heat sink around which the fan 241 is rotating.

Figure 19:
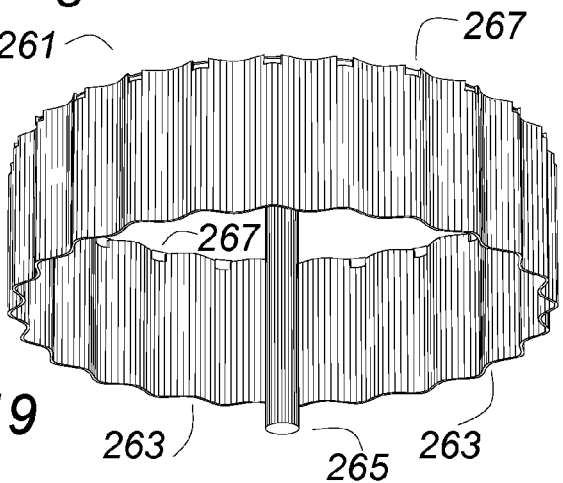
FIG. 19 shows another wave-ring fan.

FIG. 19 shows a ring-wave fan 261 having a plurality of ridges 243—243 on its periphery. A shaft 265 may connect to a motor means to rotate the fan 261. A plurality of vents 267—267 around the top periphery of the fan 261 provide an exit for air which may enter at the open bottom of the fan, to promote air circulation through the fan.

Figure 20:
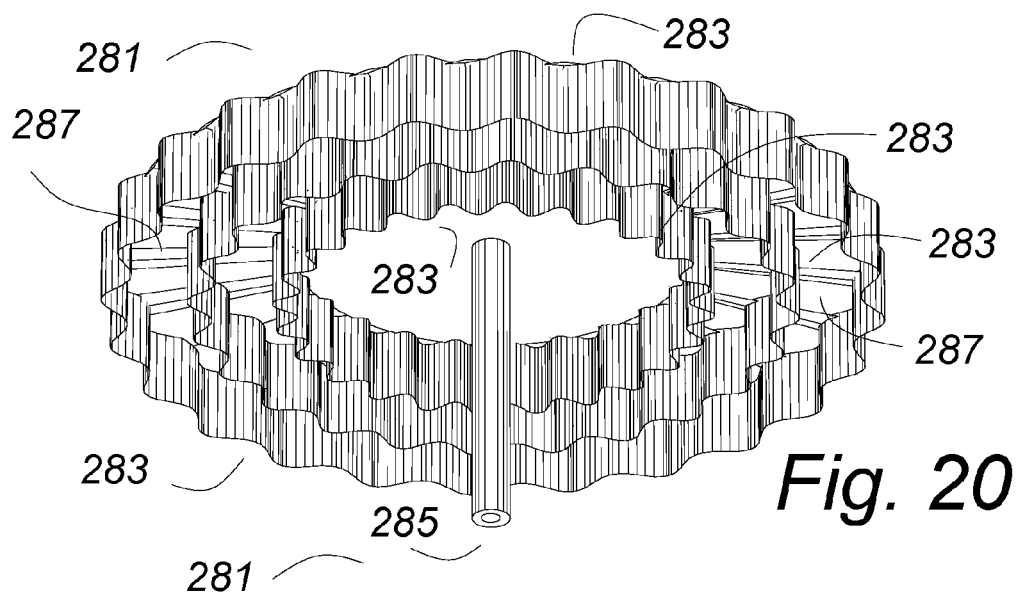
FIGS. 20 and 21 show a wave-ring fan with three rings.
Figure 21:
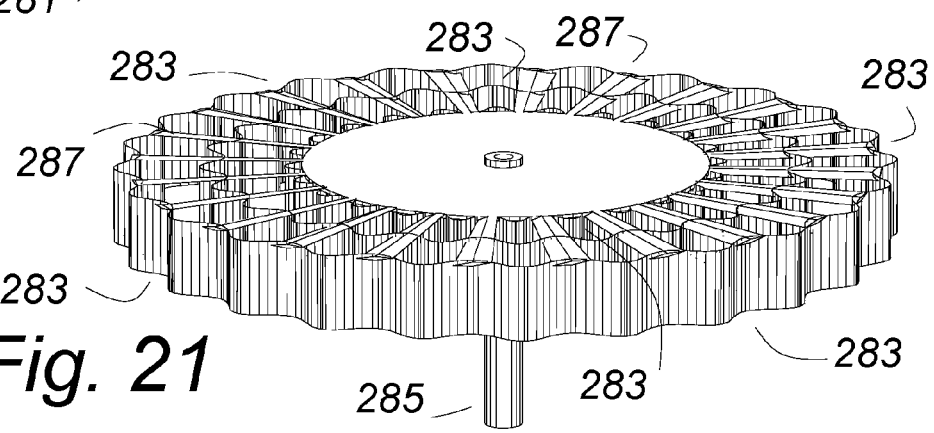

FIGS. 20 and 21 show a wave-ring fan 281 having a plurality of concentric wave rings 283—283 supported and rotated by a plurality of spokes 287—287. A shaft 285 may connect to a motor means to rotate the fan 281.

Figure 22:
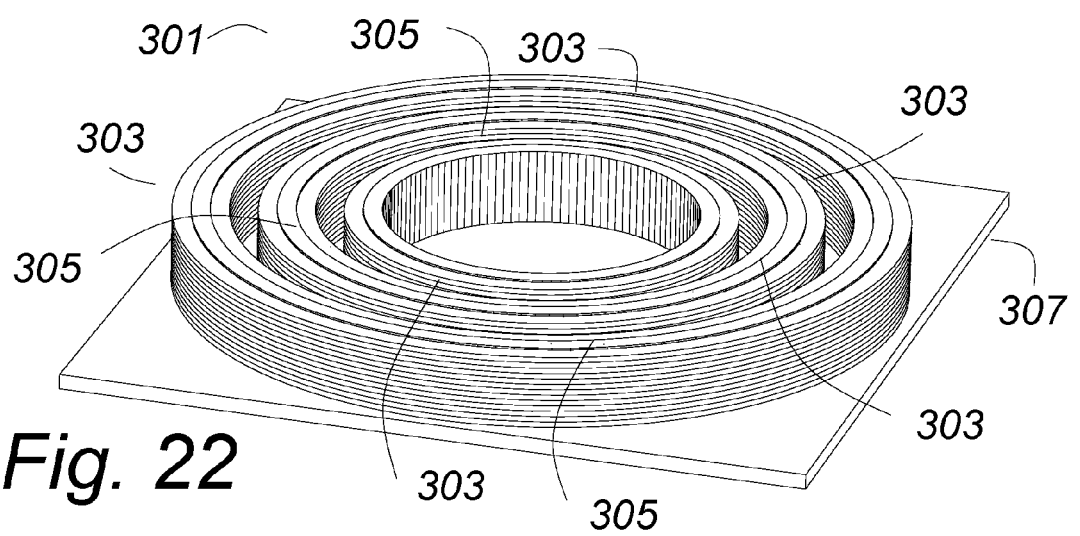
FIG. 22 shows a cylindrical finned heat sink with five finned heat sink surfaces, for use with the wave-ring fan of FIGS. 20 and 21.

FIG. 22 shows a cylindrical heat sink 301 having a plurality of heat sink fins 303—303 mounted on and in good thermal contact with a plurality of metal cylinders 305—305. The metal cylinders 305—305 are mounted on and in good thermal contact with a base plate 307.

The invention claimed is:

1. A wave-fan with a heat sink, comprising a wave-fan, a heat sinking means and a motor means for rotating the wave-fan relative to the heat sinking means,
   the heat sinking means having at least one active heat dissipating surface,
   the wave-fan having at least one active fluid moving surface which conforms generally to the at least one active heat dissipating surface of the heat sinking means, and the at least one active fluid moving surface of the wave-fan comprising a plurality of ridges and valleys having a roughly sinusoidal contour along the direction of rotation of the wave fan.

2. The wave-fan with a heat sink of claim 1 wherein the at least one active heat dissipating surface of the heat sinking means and the at least one active fluid moving surface of the wave fan are generally flat surfaces.

3. The wave-fan with a heat sink of claim 1 wherein the at least one active heat dissipating surface of the heat sinking means and the at least one active fluid moving surface of the wave fan are generally cylindrical surfaces.

4. The wave-fan with a heat sink of claim 2 wherein the wave-fan further comprises a plurality of fluid inlet ports inboard of the at least one active fluid moving surface.

5. The wave-fan of claim 4 wherein the plurality of fluid inlet ports wherein the plurality of fluid inlet ports are orientated such that fluid entering the plurality of fluid inlet ports flows against the centrifugal force generated by the rotation of the wave-fan.

6. A wave-fan for causing a pulsating motion within a heat conducting fluid within an immediately adjacent heat sinking means comprising at least one active fluid moving surface facing the heat sinking means comprising a plurality of ridges and valleys having a roughly sinusoidal contour along the direction of rotation, and a motor means for rotating the wave-fan.

7. The wave fan of claim 6 wherein the wave fan is a wave-plane fan and the at least one active fluid moving surface conforms to a flat heat sinking means.

8. The wave fan of claim 6 wherein the wave fan is a wave-ring fan and the at least one active fluid moving surface conforms to a cylindrical heat sinking means.

* * * * *